United States Patent [19]

Masaki et al.

[11] Patent Number: 4,740,714
[45] Date of Patent: Apr. 26, 1988

[54] ENHANCEMENT-DEPLETION CMOS CIRCUIT WITH FIXED OUTPUT

[75] Inventors: Yoshifumi Masaki, Nara; Setsufumi Kamuro, Yamatokoriyama, both of Japan

[73] Assignee: Sharp Kabushiki Kaisha, Osaka, Japan

[21] Appl. No.: 6,309

[22] Filed: Jan. 15, 1987

Related U.S. Application Data

[63] Continuation of Ser. No. 603,331, Apr. 24, 1984, abandoned.

[30] Foreign Application Priority Data

Apr. 30, 1983 [JP] Japan ................................ 58-76394

[51] Int. Cl.$^4$ .................. H01L 29/86; H03K 19/094; G11C 17/00
[52] U.S. Cl. .................................... 307/279; 307/450; 307/451; 357/42; 357/91; 365/95; 365/156
[58] Field of Search .................. 307/279, 450, 451; 357/42, 91; 365/95, 156

[56] References Cited

U.S. PATENT DOCUMENTS

| | | | |
|---|---|---|---|
| 3,639,813 | 2/1972 | Kamoshida et al. | 307/450 |
| 3,939,642 | 2/1976 | Morozumi | 357/42 |
| 3,958,266 | 5/1976 | Athanas | 357/42 |
| 4,280,272 | 7/1981 | Egawa et al. | 357/42 |
| 4,315,781 | 2/1982 | Henderson | 357/42 |
| 4,461,965 | 7/1984 | Chin | 307/279 |
| 4,496,857 | 1/1985 | Chao | 307/279 |
| 4,594,688 | 6/1986 | Uno | 365/95 |

Primary Examiner—Andrew J. James
Assistant Examiner—John Lamont
Attorney, Agent, or Firm—Birch, Stewart, Kolasch & Birch

[57] ABSTRACT

In a CMOS FET IC element including at least one pair of transistors with connected drains, one an N-channel MOSFET and one a P-channel MOSFET, the N-channel MOSFET having a first threshold voltage controlled by the implantation of an ion, and the P-channel MOSFET having a second threshold voltage control are implanted with the same type of ion, so that one of the pair of transistors, either the N-channel MOSFET or the P-channel MOSFET is of a type that is normally ON, and the other MOSFET is of a type that is normally OFF with any gate voltage between the two voltages supplied to their sources.

8 Claims, 2 Drawing Sheets

ENHANCEMENT-DEPLETION CMOS CIRCUIT WITH FIXED OUTPUT

This application is a continuation of application Ser. No. 603,331 filed on Apr. 24, 1984 and now abandoned.

BACKGROUND OF THE INVENTION

The present invention relates to a CMOS FET IC (a Complementary Metal Oxide Semiconductor Field Effect Transistor Integrated Circuit) element and, more particularly to a CMOS FET IC element, having at least one pair of transistors, one an N channel MOS FET and one a P channel MOS FET, which selects a suitable signal level.

FIG. 1 shows a circuit diagram of a typical level selection circuit using N channel MOS FETs. This level selection circuit is used when a ROM (Read Only Memory) is the CMOS FET IC element, or when a chip selection signal level is chosen.

Referring to FIG. 1, in the case where a logic level of either an input terminal A1 (for example, a high logic level) or an input terminal B1 (for example, a low logic level) is selected, a threshold voltage of either N channel MOS FET Q1 or Q2 is set larger than a voltage +Vcc that is supplied to the gate of each N channel MOS FET Q1 and Q2 by using a P type ion implantation with a photomask, so that the N channel MOS FET that is implanted by the P type ion is of a type that is normally OFF and a source-drain current of the N channel MOS FET that is implanted by the P type ion cannot flow even when the voltage Vcc is applied. For example, when a logic level of the input terminal A1 is outputted at an output terminal C1, a threshold voltage Vth2 of the N channel MOS FET Q2 is set to be greater than the voltage Vcc by P type ion implantation, the N channel MOS FET Q2 is normally OFF, so that the source-drain current of the N channel MOS FET Q2 does not flow even when the voltage Vcc is applied. Therefore, when the voltage Vcc is applied and becomes greater than a threshold voltage Vth1 of the N channel MOS FET Q1 without the implanted ion, the N channel MOS FET Q1 is turned ON, and the source-drain current of the N channel MOS FET Q1 flows, so that the output terminal C1 is charged by the source-drain current of the N channel MOS FET Q1 and the voltages of the output terminal C1 and the input terminal A1 are not equal. Accordingly, the logic level of the input terminal A1 is outputted at the output terminal C1.

On the contrary, when a logic level of the input terminal B1 is to be outputted at the output terminal C1, the threshold voltage Vth1 of the N channel MOS FET Q1 is set greater than the voltage Vcc by P type ion implantation and the N channel MOS FET Q1 is normally OFF, so that the source-drain current of the N channel MOS FET Q1 cannot flow even when the voltage Vcc is applied. Therefore, when the voltage Vcc is applied and becomes greater than the threshold voltage Vth2, the MOS FET Q2 is turned ON, and the source-drain current of the N channel MOS FET Q2 without the implanted ion flows, so that the output terminal C1 is charged by the source-drain current of the N channel MOS FET Q2 and the voltages of the output terminal C1 and the input terminal B1 are equal. Accordingly, the logic level of the input terminal B1 is outputted from the output terminal C1.

In the above level selection circuit, for example, in the case where the logic level (the high logic level) of the input terminal A1 is outputted from the output terminal C1, a logic level corresponding to a voltage obtained by subtracting the threshold voltage Vth1 of the N channel MOS FET Q1 from the voltage corresponding to the logic level of the input terminal A1, is outputted at the output terminal C1. Accordingly, when the output of an inverter is to be inverted in response to the logic level of the output terminal C1, it cannot be inverted because the logic level of the output terminal C1 is lower than the logic level by an amount corresponding to the threshold voltage Vth1. Therefore, a level rectifying circuit is additionally required.

SUMMARY OF THE INVENTION

It is an object of the present invention to provide an improved CMOS FET IC element comprising at least two transistors one an N channel MOS FET controlled at a first threshold voltage by implanting an ion and one a P channel MOS FET controlled at a second threshold voltage by implanting the same ion.

It is another object of the present invention to provide an improved CMOS FET IC element having a P channel MOS FET and an N channel MOS FET whose threshold voltages are controlled by implanting an ion with the same photomask.

It is still another object of the present invention to provide an improved level selection circuit using a CMOS FET IC element which selects a suitable level for correctly operating a circuit.

Other objects and further scope of applicability of the present invention will become apparent from the detailed description given hereinafter. It should be understood, however, that the detailed description of and specific examples, while indicating preferred embodiments of the invention, are given by way of illustration only, since various changes and modifications within the spirit and scope of the invention will become apparent to those skilled in the art from this detailed description.

According to an embodiment of the present invention, a CMOS FET IC element including at least two transistors, one an N channel MOS FET and one a P channel MOS FET, with the N channel MOS FET controlled at a first threshold voltage by implanting an ion, and the P channel MOS FET controlled at a second threshold voltage by implanting the same type ion, so that either the N channel MOS FET or the P channel MOS FET is normally ON and the other MOS FET is normally OFF. Preferably, the CMOS FET element comprises two pairs of transistors, each pair consisting of an N channel MOS FET and a P channel MOS FET, which are cross-coupled.

BRIEF DESCRIPTION OF THE DRAWINGS

The present invention will be better understood from the detailed description given hereinbelow and the accompanying drawings which are given by way of illustration only, and thus are not limitative of the present invention and wherein.

DETAILED DESCRIPTION OF THE INVENTION

Figure 2:
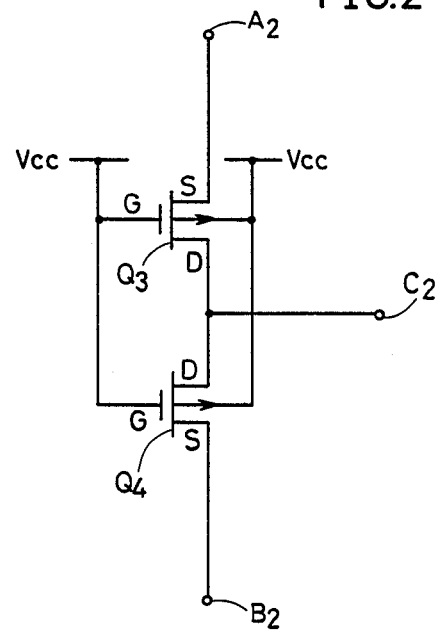
FIG. 2 shows a circuit diagram of a level selection circuit using P channel MOS FETs.
Figure 3:
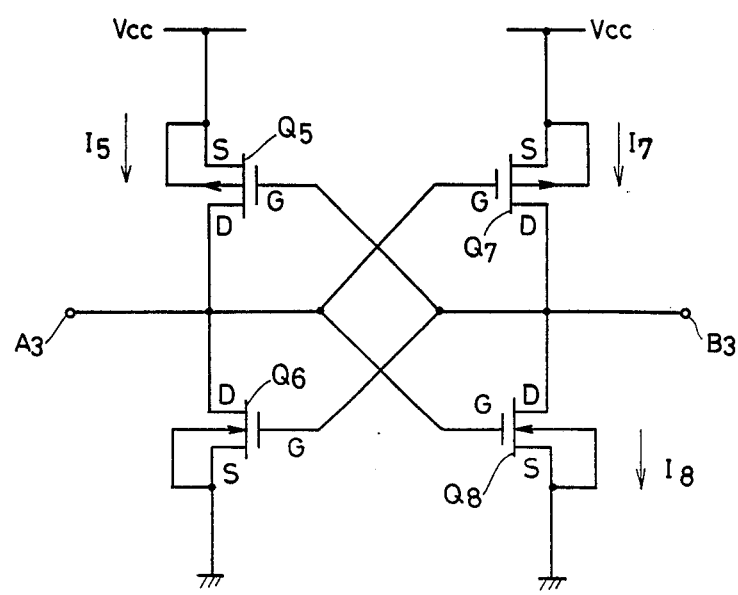
FIG. 3 shows a circuit diagram of a maskprogram level selection circuit according to an embodiment of the present invention.

FIG. 2 shows a circuit diagram of a level selection circuit using P channel MOS FETs. FIG. 3 shows a circuit diagram of a maskprogram level selection circuit according to an embodiment of the present invention.

Figure 4:
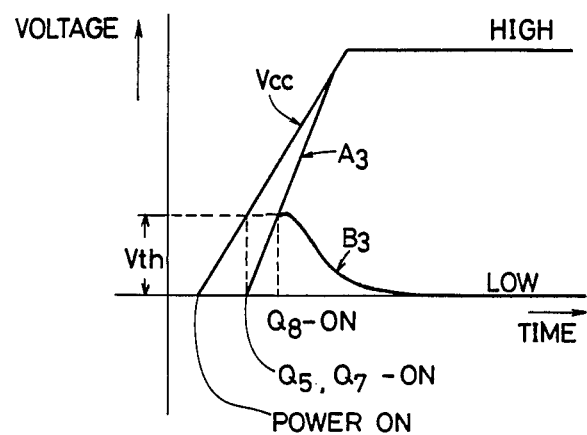
FIG. 4 is a graph showing the normal circuit operation in FIG. 3 when only an N channel MOS FET Q6 is implanted with a P type ion.
Figure 5:
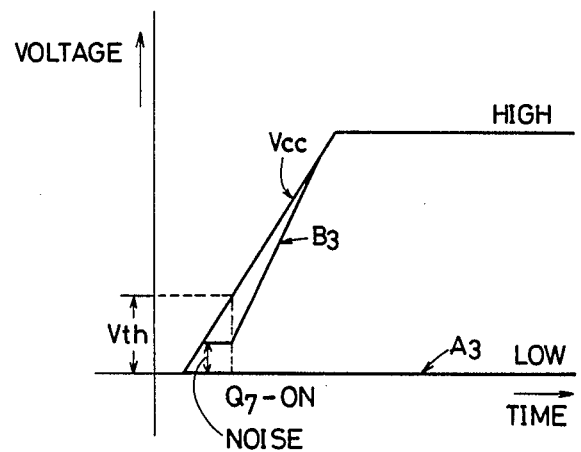
FIG. 5 is a graph showing the error circuit operation in FIG. 3 when only an N channel MOS FET Q6 is implanted with a P type ion.
Figure 6:
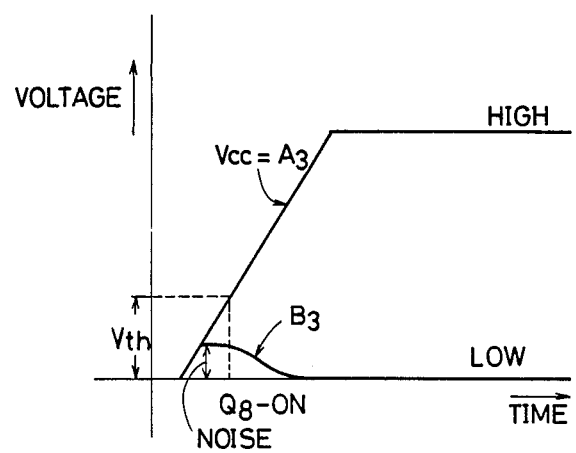
FIG. 6 is a graph showing the circuit operation according to the embodiment of the present invention.

A level selection circuit of a CMOS FET IC element as shown in FIG. 3 comprises a first CMOS inverter comprising a first pair of transistors, a P channel MOS FET Q5 and an N channel MOS FET Q6 and a second CMOS inverter comprising a second pair of transistors, a P channel MOS FET Q7 and an N channel MOS FET Q8, which are cross-coupled. An output terminal A3 outputs a high logic level, and an output terminal B3 outputs a low logic level. S designates a source, G designates a gate, and D designates a drain. $I_5$ designates a source-drain current of the P channel MOS FET Q5, $I_7$ designates a source-drain current of the P channel MOS FET Q7, and $I_8$ designates a source-drain current of the N channel MOS FET Q8. Before the ion is implanted, the P channel MOS FETs Q5 and Q7 and the N channel MOS FETs Q7 and Q8 have threshold voltages Vth5, Vth7, Vth6, and Vth8, respectively. For descriptive purposes, $Vth=Vth5=Vth6=Vth7=Vth8$ prior to implantation as shown in FIGS. 4, 5, and 6.

The source of the P channel MOS FETs Q5 and Q7 are connected to a power source (a voltage, +Vcc), and the sources of the N channel MOS FETs Q6 and Q8 are grounded.

In FIG. 3, either the first inverter or the second inverter is implanted with an ion with a photomask. For example, the first inverter (the P channel MOS FET Q5 and N channel MOSFET Q6) is implanted with the P-type ion, so that the output terminal of the ion implanted inverter outputs only the high logic level or the low logic level.

THE CMOS FET IC element of the present invention may include at least one pair of transistors, one an N channel MOS FET and one a P channel MOS FET on a semiconductor base, and the threshold voltages of the N channel MOS FET and the P channel MOS FET are controlled by the ion implantation with the same photomask, so that a level selection circuit of the CMOS FET IC element forms a ROM, or can control a level of a chip selection signal.

Preferably, the level selection circuit of the present invention comprises two pairs of transistors, each pair including an N channel MOS FET and a P channel MOS FET.

The operation of an embodiment of the present invention will be described with reference to the principles of FIGS. 1 and 2.

Figure 1:
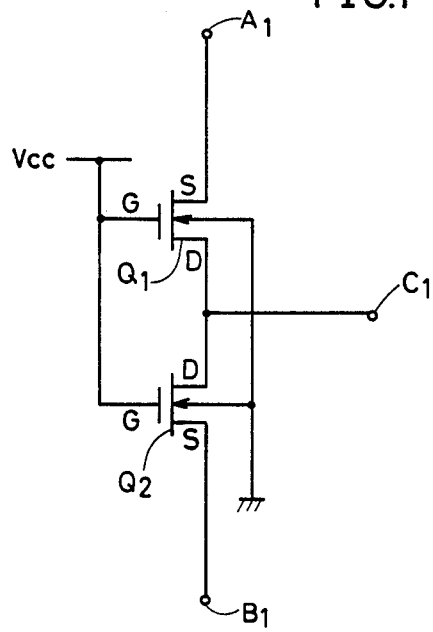
FIG. 1 shows a circuit diagram of a typical level selection circuit using N channel MOS FETs.

With reference to FIG. 2, either a P channel MOS FET Q3 or Q4, because of the implanted ion, is normally ON, and is called a depletion type MOS FET while implantation with the same ion with the same photomask of N channel MOS FETSs turns OFF either of the N channel MOS FETS, Q1 or Q2 of FIG. 1.

Generally, the N channel MOS FET has a positive threshold voltage, and the P channel MOS FET has a negative threshold voltage. In this embodiment of the present invention, the threshold voltage of the P channel MOS FET becomes zero by the P type ion implantation, and the threshold voltage of the N channel MOS-FET becomes more positive by the P type ion implantation.

In FIGS. 1 and 2, the N channel MOSFET which is not implanted with the P type ion is turned ON and the P channel MOSFET which is not implanted with the P type ion is turned OFF when a voltage +Vcc is applied to each gate of the P and N channel MOSFETs Q1–Q4. The N channel MOSFET which is implanted by the P type ion is of a type that is normally OFF and the P channel MOSFET which is implanted by the P type ion is of a type that is normally ON such as a depletion type.

In the level selection circuit using the N channel MOSFETs Q1 and Q2 of FIG. 1, the logic level, A1 or B1, of the input terminal of the N channel MOSFET which is not implanted by the P type ion is outputted from the output terminal C1. In the level selection circuit using the P channel MOSFETs Q3 and Q4 of FIG. 2, the logic level, A2 or B2, of the input terminal of the P channel MOSFET of the depletion type that is normally ON due to implantation is outputted from the output terminal C2.

In the case where an N type ion is implanted in either the N channel MOSFET Q1 or Q2 of FIG. 1, the logic level, A1 or B1, of the input terminal of the N channel MOSFET of the type that is normally ON due to implantation is outputted from the output terminal C1. In cases where the N type ion is implanted in either the P channel MOSFET Q3 or Q4 of FIG. 2, the logic level, A2 or B2, of the input terminal of the P channel MOSFET of the type that is normally OFF due to implantation is outputted from the output terminal C2.

For example, in the level selection circuit of FIG. 2, when the logic level (for example, a high logic level) of the input terminal A2 is selected, the P channel MOSFET Q3 is of the depletion type that is normally ON due to implantation with P type ion, so that the logic level of the input terminal A2 is correctly outputted from the output terminal C2 without a drop in level because the threshold voltage Vth3 of the P channel MOSFET Q3 implanted with the P type ion is zero. Accordingly, the problem of FIG. 1 as discussed in the background of the present invention is resolved.

When the ion is implanted, conventionally, the P type ion is a B (boron) ion, and the N type ion is a P (phosphorus) ion.

In the present invention, the N channel MOSFET and the P channel MOSFET are both implanted with the same type ion with the same photomask to control the threshold voltage of the N channel MOSFET and the P channel MOSFET. For example, either the N channel MOSFET Q6 or Q8 and either the P channel MOSFET Q5 or Q7 are implanted by the same type ion (for example, the P type ion) with the same photomask.

In the circuit of FIG. 3, if only one of the N channel MOSFETs Q6 or Q8 is implanted with a P type ion so that it is of the type that is normally OFF, the following problem arises.

FIG. 4 is a graph showing the normal circuit operation in FIG. 3 when only the N channel MOSFET Q6 is implanted with the P type ion. FIG. 5 is a graph showing the error circuit operation in FIG. 3 when only the N channel MOSFET Q6 is implanted with the P type ion.

With reference to FIGS. 3 and 4, when the power (the voltage +Vcc) is supplied to the P channel MOSFETS Q5 and Q7 and the voltage Vcc approximately equals the threshold voltages Vth5 and Vth7 of the P channel MOSFETs Q5 and Q7, the threshold voltages being approximately equal, the current $I_5$ of the P channel MOSFET Q5 and the current $I_7$ of the P channel MOSFET Q7 start flowing and the output terminals A3 and B3 start to be charged. Thereafter, when the voltage of the output terminal A3 is approximately equal to the threshold voltage Vth8 of the N channel MOSFET Q8, the N channel MOSFET Q8 is switched ON, and the current $I_8$ of the N channel MOSFET Q8 flows. Therefore, a current for charging the output terminal B3 becomes a current of $I_7$ minus $I_8$, so that the current $I_5$ is greater than the current $I_7$ because the potential of the output terminal A3 becomes higher than the potential of the output terminal B3. The difference between the currents $I_5$ and $I_7$ is amplified, and the level of the output terminal A3 becomes a Vcc level (the high logic level) and the level of the output terminal B3 becomes a ground level (the low logic level).

But, as shown in FIG. 5, in the case where only the N channel MOSFET Q6 is implanted by the P type ion and the N channel MOSFET Q6 is of the type of normally OFF switching, noise may be generated by supplying the power and it will be applied to the output terminal B3, so that the voltage of the output terminal B3 may become a little greater than zero and a gate voltage of the P channel MOSFET Q5 becomes greater. Therefore, the current $I_7$ of the P channel MOSFET Q7 becomes greater than the current $I_5$ of the P channel MOSFET Q5 because the level of the output terminal B3 becomes greater than the level of the output terminal A3 by the noise before the N channel MOSFET Q8 is switched ON. As a result, the output terminal B3 is further charged. When the difference between the voltage Vcc and the charged voltage of the output terminal B3 is approximately equal to the threshold voltage Vth5 of the P channel MOSFET Q5, the charging of the output terminal A3 is stopped. Accordingly, finally, the output terminal B3 is charged only by the voltage Vcc and the level of the output terminal B3 reaches to the Vcc level (the high logic level), and the level of the output terminal A3 reaches the ground level (the low logic level). A source-drain current of the N channel MOSFET Q6 of the type that is normally OFF switching does not flow. This is opposed to the estimated operation.

In this embodiment of the present invention two transistors, one of the N channel MOSFETs Q6 or Q8 and one of the P channel MOSFETs Q5 or Q7, are implanted by the same ion (for example, the P type ion) with the same photomask for the resolution of the above problem.

FIG. 6 is a graph showing the circuit operation according to the embodiment of the present invention.

With reference to FIGS. 3 and 6, in case where the N channel MOSFET Q6 and the P channel MOSFET Q5 are implanted by the P type ion with the same photomask, when the power (the +Vcc voltage) is applied to the P channel MOSFETs Q5 and Q7, it is assured that the current $I_5$ flows and the output terminal A3 starts to be charged. In the P channel MOSFET Q7, the current $I_7$ does not flow because the voltage applied from the voltage Vcc to the P channel MOSFET Q7 and the voltage applied from the output terminal A3 to the gate of the P channel MOSFET Q7 are nearly equal. Accordingly, the output terminal B3 does not start to be charged because the difference between the voltage applied from the voltage Vcc and the voltage applied from the output terminal A3 is smaller than the threshold voltage Vth7 of the P channel MOSFET Q7. The output terminal A3 is further charged, and the N channel MOSFET Q8 is switched ON when the voltage of the output terminal A3 approximately equals the threshold voltage Vth8 of the N channel MOSFET Q8. If noise is not applied to the output terminal B3, the level of the output terminal A3 becomes the Vcc level (the high logic level) and the level of the output terminal B3 becomes the ground level (the low logic level).

If any noise is applied to the output terminal B3 when applying the power (the +Vcc voltage), the voltage of the terminal B3 is greater than zero. But, as the P channel MOSFET Q5 is of the type that is normally ON, such as the depletion type, the noise (the voltage of the terminal B3) does not influence the gate level of the P channel MOSFET Q5. Therefore, the current $I_5$ is continuously increased and the output terminal A3 is further charged. Thereafter, when the voltage of the output terminal A3 approximately equals the threshold voltage Vth8 of the N channel MOSFET Q8, the N channel MOSFET Q8 is switched ON and the current $I_8$ flows, so that the level of the output terminal B3 is decreased. Finally, the level of the output terminal A3 becomes the Vcc level and the level of the output terminal B3 becomes the ground level.

As the N channel MOSFET Q6 is implanted with the P type ion and is of the type that is normally OFF, the source-drain current of the N channel MOSFET Q6 does not flow.

According to the embodiment of the present invention, the P channel MOSFET Q5 is implanted with the P type ion and is of the type that is normally ON, called the depletion type, so that the high logic level is outputted from the output terminal A3 and the low logic level is outputted from the output terminal B3 without the influence of the noise.

The N type ion in place of the P type ion may be used for implanting the ion.

According to the present invention, the pair of the P channel MOSFET and the N channel MOSFET are both implanted by the same ion with the same photomask, so that one or more levels can be correctly selected without the influence of the noise.

The invention being thus described, it will be obvious that the same may be varied in many ways. Such variations are not to be regarded as a departure from the spirit and scope of the invention, and all such modifications are intended to be included within the scope of the following claims.

What is claimed is:

1. A switching element comprising:
a first complementary transistor pair including:
a first N-channel FET having a first gate, first drain and first source, and
a second P-channel FET having a second gate, second drain and second source,
said first and second gates being commonly connected to form a transistor pair input,
said first and second drains being commonly connected,
said first and second sources being connected to first and second voltages, respectively;

said first and second FETs having an implantation of an ion dopant of a single type, the concentration of said ion dopant being sufficient to cause one of said first and second FETs to be conductive and the other of said FETs to be non-conductive independent of the application of any voltage between said first and second voltages to said transistor pair input.

2. The switching element of claim 1 wherein said ion dopant provides a first voltage threshold level required for conduction in said first FET and a second voltage threshold level required for conduction in said second FET which is different from said first voltage threshold level.

3. The switching element of claim 1 further comprising:
 a second complementary transistor pair including, a third N-channel FET having a third gate, third drain and third source, and
 a fourth P-channel FET having a fourth gate, fourth drain and fourth source,
 said third and fourth gates being commonly connected and connected to said first and second drains,
 said third and fourth drains being commonly connected and connected to said first and second gates;
 said third and fourth sources being connected to third and fourth voltages, respectively.

4. The switching element of claim 3 wherein said first voltage equals said third voltage and said second voltage equals said fourth voltage.

5. The element of claim 4 wherein the voltage developed at said first and second commonly connected drains drives only one of said third and fourth FETs into conduction so that ion implantation of said third and fourth FETs is unnecessary to ensure stability of said second complementary transistor pair.

6. The element of claim 1, wherein said ion dopant is a P type ion dopant.

7. The element of claim 1, wherein said ion dopant is an N type ion dopant.

8. The switching element of claim 1 wherein said first and second FETs are CMOS FETs.

* * * * *